United States Patent
Kanamori

[11] Patent Number: 6,165,847
[45] Date of Patent: Dec. 26, 2000

[54] NONVOLATILE SEMICONDUCTOR MEMORY DEVICE AND METHOD FOR MANUFACTURING THE SAME

[75] Inventor: Kohji Kanamori, Tokyo, Japan

[73] Assignee: NEC Corporation, Tokyo, Japan

[21] Appl. No.: 09/289,192

[22] Filed: Apr. 9, 1999

Related U.S. Application Data

[62] Division of application No. 08/988,184, Dec. 10, 1997, abandoned.

[30] Foreign Application Priority Data

Dec. 13, 1996 [JP] Japan ................................. 8-333818

[51] Int. Cl.[7] .............................................. H01L 21/8247
[52] U.S. Cl. ......................... 438/266; 438/302; 438/525; 438/919
[58] Field of Search ................................... 438/266, 267, 438/302, 525, 919

[56] References Cited

U.S. PATENT DOCUMENTS

| 4,763,299 | 8/1988 | Hazani . |
| 5,042,009 | 8/1991 | Kazerounian et al. . |
| 5,776,787 | 7/1998 | Keshtbod . |
| 5,918,137 | 6/1999 | Ng et al. .................................. 438/454 |
| 6,051,860 | 4/2000 | Odanaka et al. ........................ 257/316 |

FOREIGN PATENT DOCUMENTS

| 58-209164 | 12/1983 | Japan . |
| 2-110981 | 4/1990 | Japan . |

*Primary Examiner*—Richard Booth
*Attorney, Agent, or Firm*—Sughrue, Mion, Zinn, Macpeak & Seas, PLLC

[57] ABSTRACT

A nonvolatile semiconductor memory device having a semiconductor substrate of a first conductive type, a floating gate and a control gate provided on the semiconductor substrate, at least a pair of impurity diffusion layers of a second conductive type defining source and drain and disposed in the semiconductor substrate in a spaced relation to each other so as to define a channel having a region covered with the floating gate and a region uncovered with the floating gate, the region uncovered with the floating gate defining a split gate, a first impurity diffusion layer region formed in the semiconductor substrate so as to be disposed at least at an area between the pair of diffusion layers, and a second impurity diffusion layer region having an impurity concentration lower than the first impurity diffusion layer region and formed in the semiconductor substrate so as to be disposed at the split gate.

3 Claims, 6 Drawing Sheets

6,165,847

NONVOLATILE SEMICONDUCTOR MEMORY DEVICE AND METHOD FOR MANUFACTURING THE SAME

This is a divisional of application Ser. No. 08/988,184 filed Dec. 10, 1997 now abandoned, the disclosure of which is incorporated herein by reference.

BACKGROUND OF THE INVENTION

1. Field of the Invention

The present invention generally pertains to a nonvolatile semiconductor memory device of a split-gate type, such as EEPROM (electrically erasable programmable read only memory), flash memory, EPROM, or the like, and a method for manufacturing such a memory device as well.

2. Description of the Related Art

Conventional nonvolatile semiconductor memory devices of the aforesaid type are known, for example, from Japanese Laid-Open Patent Application No. Hei 2-110981, which describes an EEPROM. As depicted in FIG. 1, the conventional EEPROM described therein comprises a P-type silicon substrate 601, a $P^+$ diffusion layer (P-type impurity diffusion layer) 602 defining a channel region, a gate oxide 603, a floating gate 604, $N^+$ diffusion layers (N-type impurity diffusion layers) 607 and 607 each defining a source or drain region serving as a virtual ground, an interlayer dielectric 608, a control gate 609, and a split gate SG.

In the P-type semiconductor substrate 601, the $P^+$ diffusion layer (channel) 602 disposed between the $N^+$ diffusion layers (source and drain) 607 and 607 comprises an area covered with the floating gate 604 and an area uncovered therewith, the latter defining the split gate SG. Despite the amount of the electric charges present in the floating gate 604, the electric current flowing this split gate SG can be controlled by the voltage applied to the control gate 609. Accordingly, even if the electrons present in the floating gate 604 are released excessively to induce a depletion state in that part of the $P^+$ diffusion layer (channel) 602 disposed underneath the floating gate 604, since the electric current can be cut off at a site of the split gate SG, the erroneous working of the EEPROM can be prevented. Thus, with the provision of the split gate SG, it is possible to achieve an increased reliability for EEPROM.

Referring to FIGS. 2(a) to 2(f), each of the steps for the manufacturing method of the aforesaid EEPROM will now be described. First, a P-type impurity diffusion layer ($P^+$ diffusion layer) 602 having an impurity concentration greater than that of a P-type silicon substrate 601 is formed on the channel area of the silicon substrate 601 with a gate oxide (thermal oxide film) 603 formed thereon (FIG. 2(a)), and then a patterning is effected for the floating gate 604 (FIG. 2(b)). Subsequently, after causing oxide to deposit on the P-type silicon substrate 601, etching-back is effected by means of anisotropic etching to form oxide side walls 605 on the opposite sides of each of the floating gates 604 (FIG. 2(c)). Thereafter, among the oxide side walls 605 formed on the opposite sides of each floating gate 604, only one of the side walls situated on one side (left side in FIG. 2(d)) is covered with photoresist 606 (FIG. 2(d)), and the exposed oxide side wall 605 on the other side (right side in FIG. 2(d)) is removed by etching.

Then, ions of N-type impurity such as arsenic (As) are implanted while permitting the floating gates 604 and the oxide side walls 605 to serve as self-aligning masks, to thereby form $N^+$ diffusion layers 607 and 607 serving as source and drain regions (FIG. 2(e)). Further, after the removal of the oxide side walls 605, thin interlayer dielectric 608 is deposited on the P-type silicon substrate 601, and control gates 609 are formed (FIG. 2(f)). An EEPROM is thus manufactured. In this method, the split gate is formed by a self-alignment process as described above. Accordingly, a high-precision split gate can be obtained.

In the conventional art as described above, however, inasmuch as the split areas are formed in a self-aligning manner by forming oxide side walls 605 on the opposite sides of a respective floating gate 604, the manufacturing process is complicated, with an increased number of steps required, resulting in lowering of yield and inflation of cost, although a sufficient precision can be achieved.

Furthermore, in the conventional art, since it is necessary to have a margin taking into consideration an alignment precision error in the photolithography step in order to protect only one of the opposite oxide side walls 605, micronization is difficult. Moreover, also in the step of forming the $P^+$ diffusion layer 602 only in the channel region of the P-type silicon substrate 601, since it is necessary to have a margin taking into consideration an alignment precision error in the photolithography step, micronization is difficult. Therefore, with the conventional art described in the aforesaid document, larger integration cannot be attained.

SUMMARY OF THE INVENTION

It is therefore an object of the present invention to provide a nonvolatile semiconductor memory device which can be obtained by a simple and short manufacturing process and achieves high precision and greater integration.

Another object of the present invention is to provide a manufacturing method specifically adapted to obtain the aforesaid nonvolatile semiconductor memory device.

According to a first aspect of the present invention, there is provided a nonvolatile semiconductor memory device comprising:

a semiconductor substrate of a first conductive type;

a floating gate and a control gate provided on the semiconductor substrate;

at least a pair of impurity diffusion layers of a second conductive type defining source and drain and disposed in the semiconductor substrate in a spaced relation to each other so as to define a channel having a region covered with the floating gate and a region uncovered with the floating gate, the region uncovered with the floating gate defining a split gate;

a first impurity diffusion layer region formed in the semiconductor substrate so as to be disposed at least at an area between the pair of diffusion layers of a second conductive type; and a second impurity diffusion layer region of a first conductive type having an impurity concentration lower than the first impurity diffusion layer region and formed in the semiconductor substrate so as to be disposed at the split gate.

In the foregoing, the first impurity diffusion layer region may be disposed so as to cover an entire memory transistor region of the semiconductor substrate. Alternatively, the first impurity diffusion layer region may be disposed only at a channel region of a memory transistor region of the semiconductor substrate.

According to another aspect of the present invention, there is provided a method for manufacturing a nonvolatile semiconductor memory device, comprising the steps of:

(a) preparing a semiconductor substrate of a first conductive type;

(b) effecting an ion implantation to implant impurity of a first conductive type into the semiconductor substrate to provide a first impurity diffusion layer region of a first conductive type in the semiconductor substrate;

(c) forming a gate dielectric film on the semiconductor substrate and forming a floating gate on the gate dielectric film;

(d) ion-implanting impurity of a second conductive type into the semiconductor substrate in an oblique direction relative to a surface of the semiconductor substrate, to thereby form at least a pair of impurity diffusion layers of a second conductive type defining source and drain, with one end overlapping with the floating gate and with the other end being spaced therefrom, and forming a split gate defined by a channel uncovered with the floating gate;

(e) ion-implanting impurity of a second conductive type into the semiconductor substrate generally perpendicularly with respect to the surface of the semiconductor substrate, to such an extent as not to invert conductive type of the semiconductor substrate at the split gate, to thereby regulate threshold voltage of the split gate;

(f) forming an interlayer dielectric so as to cover the floating gate and forming a control gate on the interlayer dielectric.

In the foregoing, the step (b) may be effected prior to the step (c), to form the first impurity diffusion layer region so as to cover an entire memory transistor region of the semiconductor substrate. Alternatively, the step (b) may be effected between the step (d) and the step (e) so as to form the first impurity diffusion region at a channel region of a memory transistor region of the semiconductor substrate. More specifically, the step (b) may include ion-implanting impurity of a first conductive type into the semiconductor substrate in an oblique direction reverse to the oblique direction in the step (d), to thereby form the first impurity diffusion layer region at a channel region of a memory transistor region of the semiconductor substrate, with one end overlapping with the floating gate and with the other end being spaced therefrom.

With the above procedures and constructions, the split gates are formed by employing not a conventional side wall process but an oblique ion-implantation process. Therefore, the manufacturing procedures result in a simple and short process. Furthermore, inasmuch as the interface between the diffusion layer region of a first conductive type impurity and the diffusion layer region of a second conductive type impurity is formed so as to be steep by rendering the impurity concentration of the impurity diffusion layer region of a first conductive type higher, controllability of the split gates can be substantially improved. Moreover, since the impurity ions of the second conductive type are implanted so as not to inverse the conductive type of the semiconductor substrate surface at the split gate region, the threshold voltages at the split gates can be controlled to proper values.

BRIEF DESCRIPTION OF THE DRAWINGS

The above and other objects, advantages and features of the present invention will be more apparent from the following description taken in conjunction with the accompanying drawings in which:

FIG. 2(a) shows a state in which $P^+$ diffusion layers are formed, FIG. 2(b) shows a state in which floating gates are formed, FIG. 2(c) shows a state in which oxide side walls are formed at the opposite sides of a respective floating gate, FIG. 2(d) shows a state in which one of the oxide side walls is covered with photoresist, FIG. 2(e) shows a state in which N-type diffusion layers are formed, and FIG. 2(f) shows a state in which interlayer dielectric and control gates are formed;

FIGS. 4(a) shows a state in which $P^+$ diffusion layers and gate oxide are formed, FIG. 4(b) shows a state in which floating gates are formed, FIG. 4(c) shows a state in which $N^+$ diffusion layers are formed, FIG. 4(d) shows a state in P-type diffusion layers are formed, and FIG. 4(e) shows a state in which interlayer dielectric and control gates are formed;

FIG. 6(a) shows a state in which gate oxide and floating gates are formed, FIG. 6(b) shows a state in which $N^+$ diffusion layers are formed, FIG. 6(c) shows a state in which $P^+$ diffusion layers are formed, FIG. 6(d) shows a state in P-type diffusion layers are formed, and FIG. 6(e) shows a state in which interlayer dielectric and control gates are formed.

DESCRIPTION OF THE PREFERRED EMBODIMENTS

The preferred embodiments of the present invention will hereinafter be described with reference to the accompanying drawings.

Figure 1:
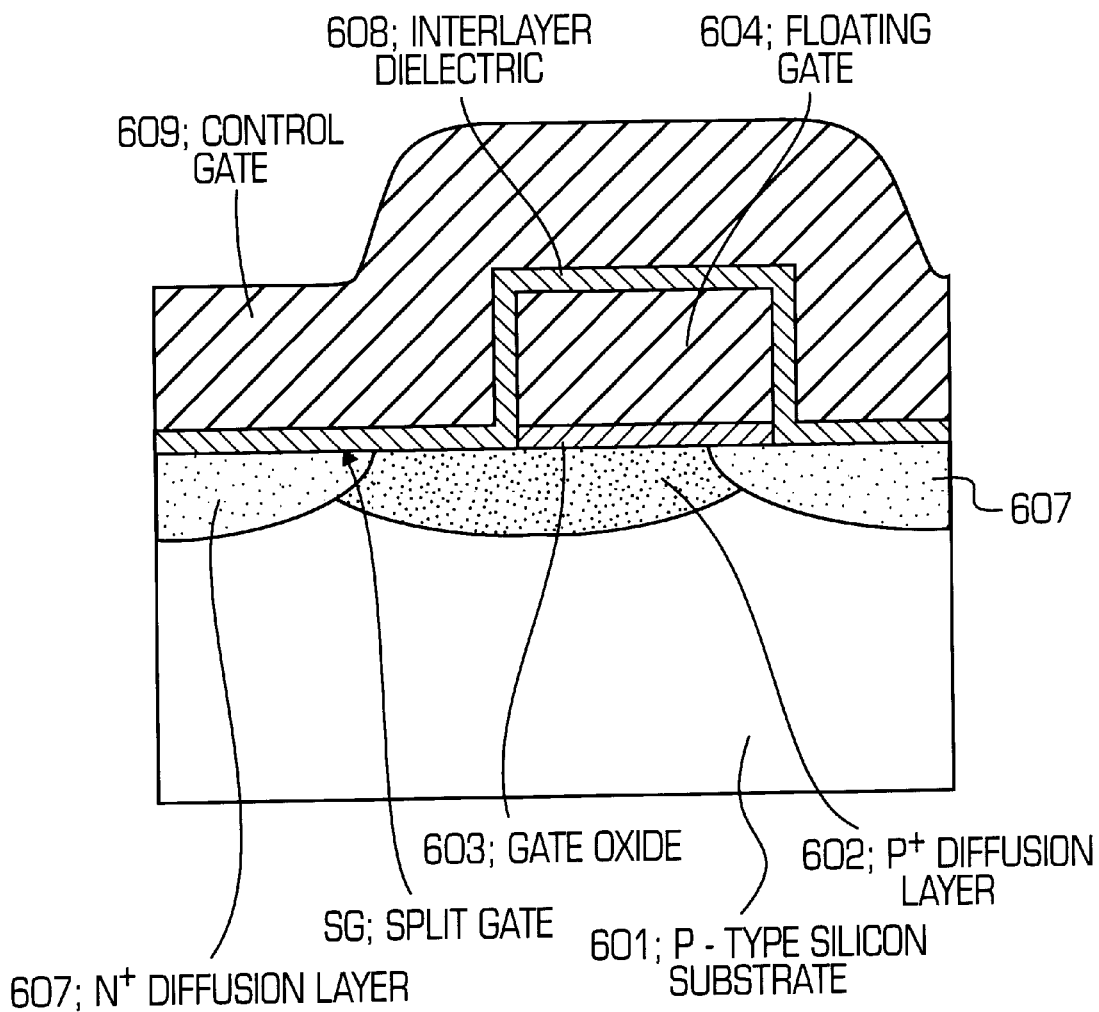
FIG. 1 is a schematic cross-sectional view of a conventional split gate-type nonvolatile semiconductor memory device.
Figure 2A:
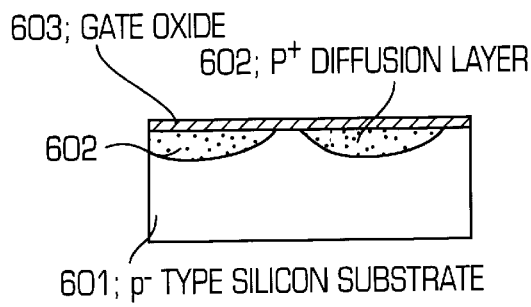
FIGS. 2(a) to 2(f) are schematic sectional views showing a manufacturing method of a conventional semiconductor memory device of FIG. 1.
Figure 2D:
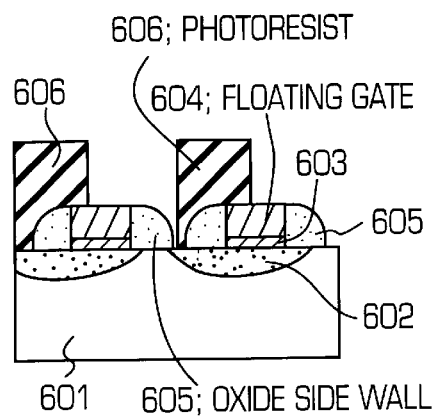
Figure 2B:
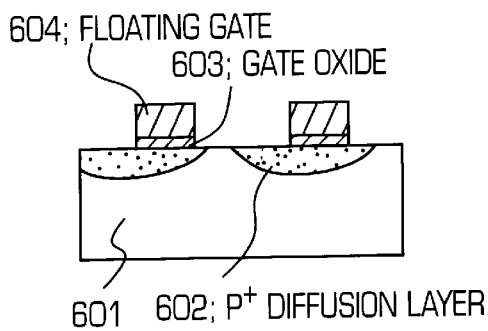
Figure 2E:
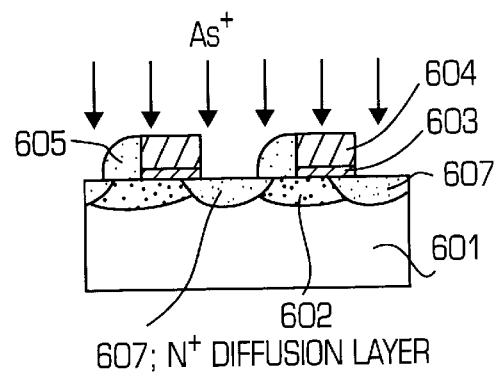
Figure 2C:
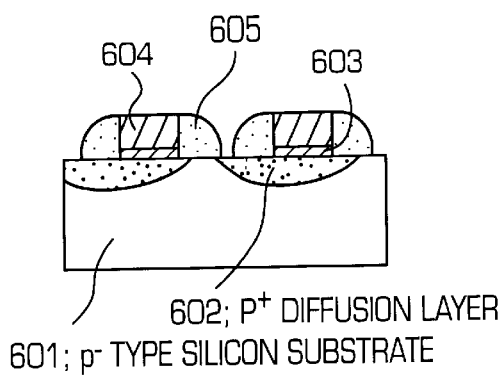
Figure 2F:
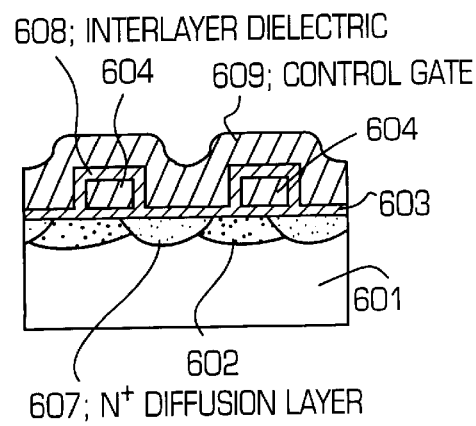
Figure 3:
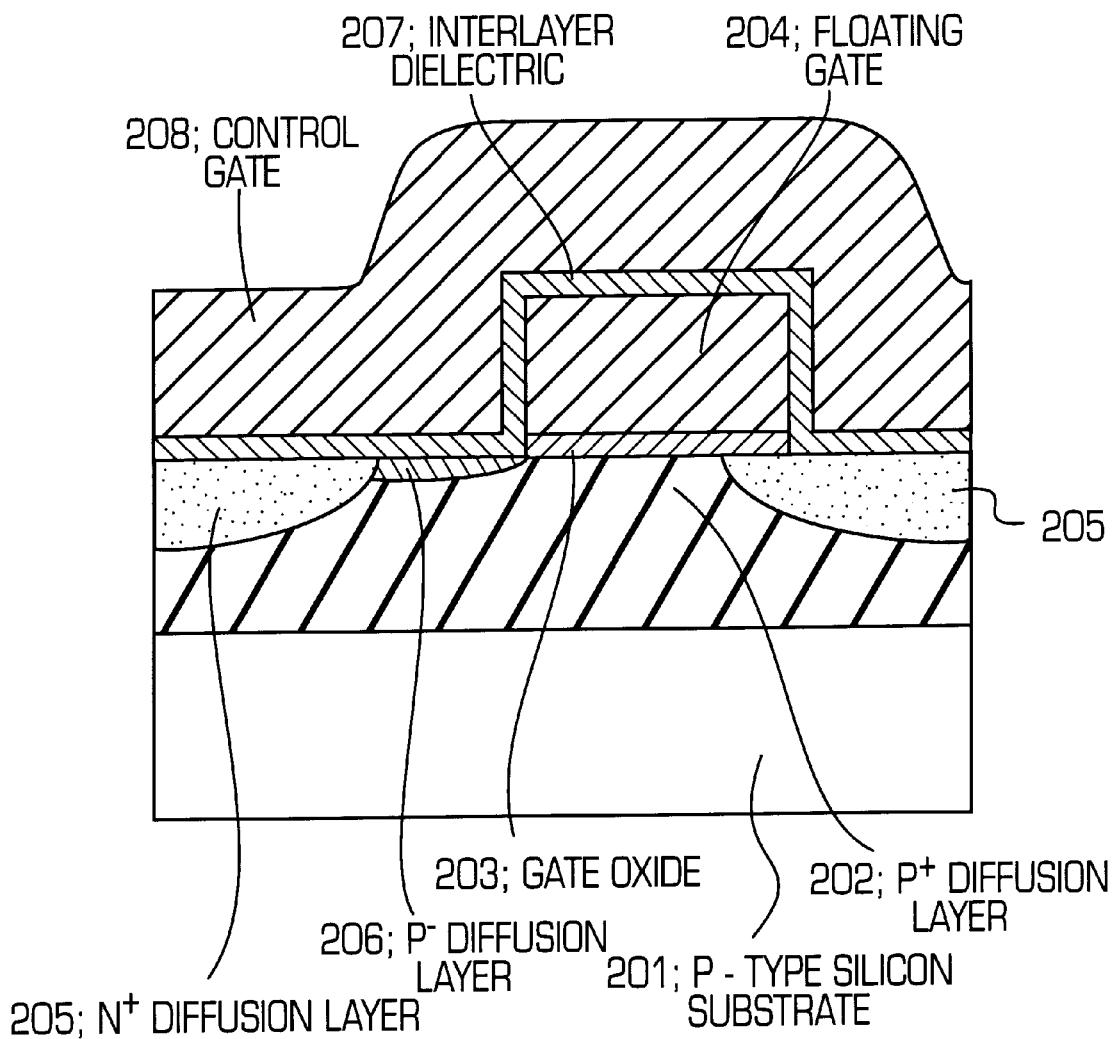
FIG. 3 is a schematic cross-sectional view of a memory cell transistor in accordance with a first embodiment of the present invention.

FIG. 3 is a cross-sectional view partially depicting a stacked structure of a memory cell transistor in accordance with a first embodiment of the present invention, whereas FIGS. 4(a) to 4(e) are cross-sectional views showing fabrication procedures therefor.

The memory cell transistor of this embodiment is a nonvolatile semiconductor memory device of a split gate type, and as depicted in FIG. 3, comprises a P-type silicon substrate 201, a $P^+$ diffusion layer (P-type impurity diffusion layer) 202, a gate oxide 203, a floating gate 204, $N^+$ diffusion layers (N-type impurity diffusion layers) 205 and 205 each defining a source or drain region serving as a virtual ground, a $P^-$ diffusion layer (P-type impurity diffusion layer) 206, an interlayer dielectric 207, and a control gate 208.

In the foregoing, the $P^+$ diffusion layer 202 having a concentration higher than the P-type silicon substrate 201 is formed in the entire area of the memory cell transistor region on the P-type silicon substrate 201, and the substrate surface at the split gate region defines the $P^-$ diffusion layer 206 which has a concentration lower than that of the $P^+$ diffusion layer 202. Furthermore, one (right end in FIG. 3) of the opposite ends of a respective floating gate 204 is overlapping with the $N^+$ diffusion layer 205, whereas the other end (left end in FIG. 3) of the floating gate 204 is offset in a spaced relation to the $N^+$ diffusion layer 205. That offset area is a split region, and the electric current flowing this split region can be controlled by the voltage applied to the control gate 208.

Next, referring to FIGS. 4(a) to 4(e), the fabrication process for the aforesaid memory cell transistor will be described.

Figure 4A:
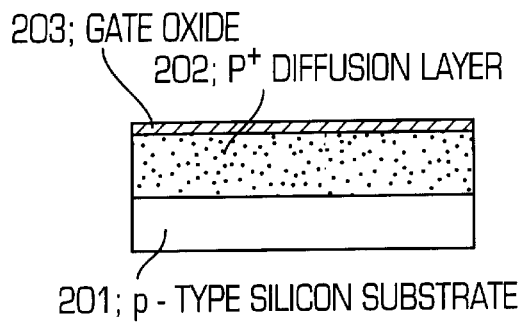
FIGS. 4(a) to 4(e) are schematic sectional views showing a manufacturing method of the memory cell transistor of FIG. 3.

First, referring to FIG. 4(a), P-type impurity, such as boron (B), is ion-implanted into the memory cell transistor region of the P-type semiconductor substrate 201, for example, at a dose of $1\times10^{12}$ cm$^{-2}$ to $1\times10^{15}$ cm$^{-2}$ to form a P$^+$ diffusion layer 202. Further, a gate oxide 203 having a film thickness of 4 to 30 nm for example is formed on the surface of the P$^+$ diffusion layer 202 by means of a thermal oxidation method.

Figure 4B:
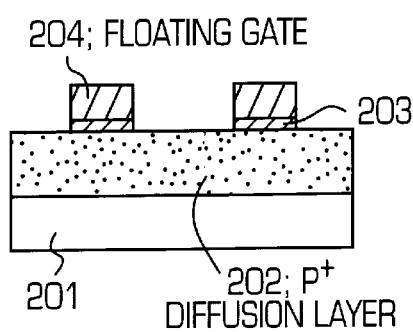

Next, as depicted in FIG. 4(b), polysilicon is deposited on the gate oxide 203, and formed into N-type by the diffusion of N-type impurity. Thereafter, using a photolithography process, a patterning is effected to form floating gates 204.

Figure 4C:
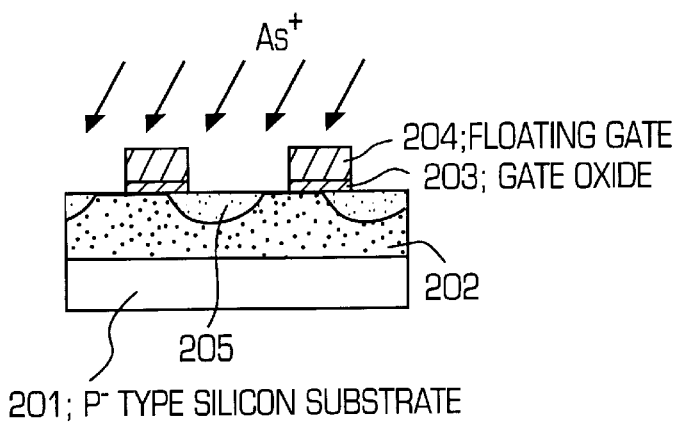

Subsequently, as shown in FIG. 4(c), by means of a self-alignment process employing the floating gates 204 as self-aligning masks, ions of N-type impurity such as arsenic (As) are implanted in an oblique or inclined direction (from right to left in FIG. 4(c)), for example, at a dose of $1\times10^{14}$ cm$^{-2}$ to $1\times10^{16}$ cm$^{-2}$ to form N$^+$ diffusion layers 205. In this step, the direction and inclination angle for the ion-implantation are determined such that one of the opposite ends (right end in FIG. 4(c)) of a respective floating gate 204 is overlapping with the N$^+$ diffusion layer 205 whereas the other end (left end in FIG. 4(c)) thereof is offset in a spaced relation to the N$^+$ diffusion layer 205.

Figure 4D:
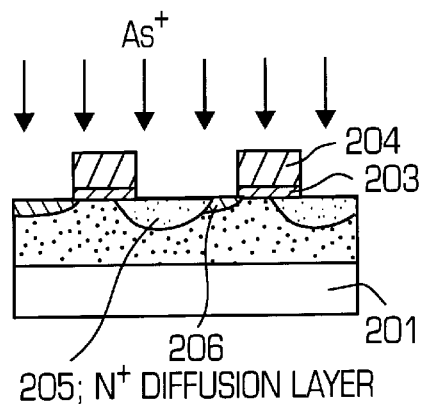

Thereafter, referring to FIG. 4(d), by means of a self-alignment process employing the floating gates 204 as self-aligning masks, ions of N-type impurity such as arsenic (As) are implanted in a direction perpendicular to the substrate, for example, at a dose of $1\times10^{11}$ cm$^{-2}$ to $1\times10^{15}$ cm$^{-2}$ to form, at the substrate surface at the split gate regions, P diffusion layers 206 each having a concentration lower than that of P$^+$ diffusion layer 202. In this step, the split gate is regulated so as to have a desired threshold voltage within a range which does not cause depletion, by controlling the ion-implantation conditions.

Figure 4E:
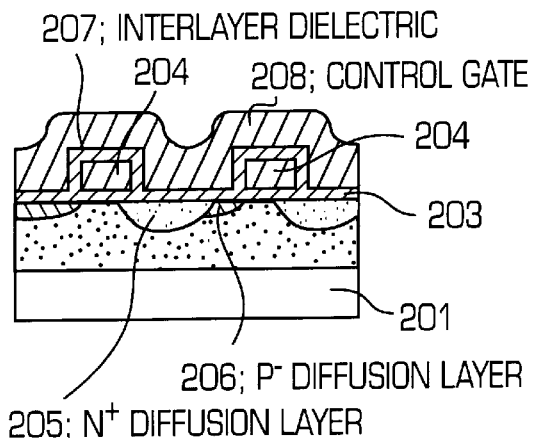

Finally, as depicted in FIG. 4(e), an interlayer dielectric 207 is formed so as to cover the floating gates 204 in order to electrically insulate the floating gates 204, and control gates 208 are further formed on the interlayer dielectric 207. Thus, a memory cell transistor is manufactured.

In the foregoing method, inasmuch as the split gate regions can be formed by a self-alignment process employing an inclined ion-implantation technique, the split gates can be produced at high precision by a simple process.

Furthermore, since the formation of the split gates is irrelevant to the alignment precision in a photolithography, larger integration can be achieved.

Figure 5:
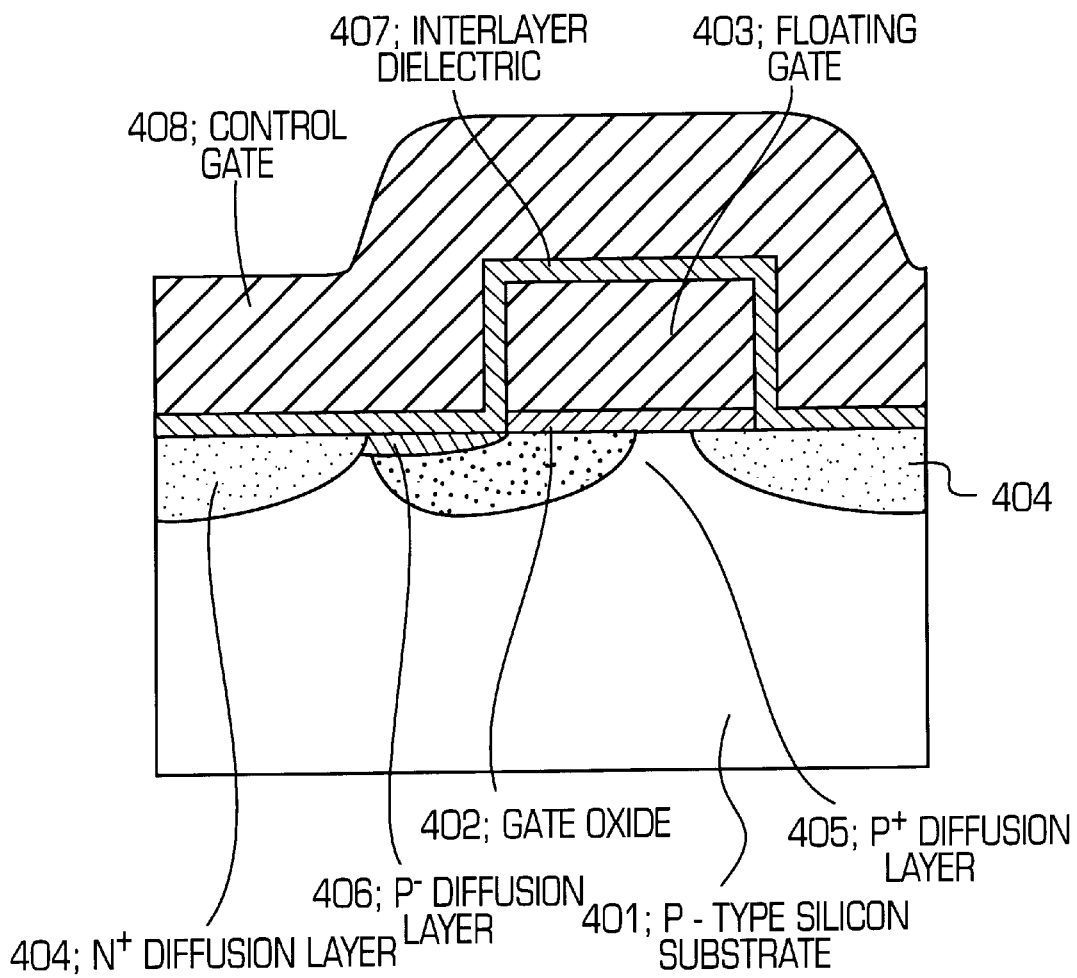
FIG. 5 is a view similar to FIG. 3, but showing a memory cell transistor in accordance with a second embodiment of the present invention.

FIG. 5 is a cross-sectional view partially depicting a stacked structure of a memory cell transistor in accordance with a second embodiment of the present invention, whereas FIGS. 6(a) to 6(e) are cross-sectional views showing fabrication procedures therefor.

As depicted in FIG. 5, the memory cell transistor of this embodiment comprises a P-type silicon substrate 401, a gate oxide 402, a floating gate 403, N$^+$ diffusion layers 404 and 404 each defining a source or drain region serving as a virtual ground, a P$^+$ diffusion layer 405, a P$^-$ diffusion layer 406, an interlayer dielectric 407, and a control gate 408. The memory cell transistor of this embodiment differs from that of the first embodiment in that the P$^+$ diffusion layer 405 having a concentration higher than the P-type silicon substrate 401 is provided not on the entire memory cell transistor region but on the channel region only.

Next, referring to FIGS. 6(a) to 6(e), the fabrication process for the aforesaid memory cell transistor will be described.

Figure 6A:
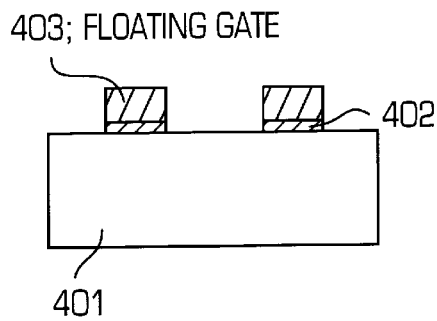
FIGS. 6(a) to 6(e) are schematic cross-sectional views showing a manufacturing method of the memory cell transistor of FIG. 5.

First, referring to FIG. 6(a), a gate oxide 402 having a film thickness of 4 to 30 nm for example is formed on the surface of the P-type silicon substrate 401 by means of a thermal oxidation method. Further, polysilicon is deposited on the gate oxide 402, and formed into N-type by the diffusion of N-type impurity. Thereafter, a patterning is effected to form floating gates 403.

Figure 6D:
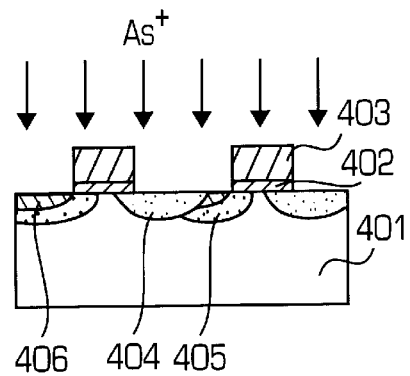
Figure 6B:
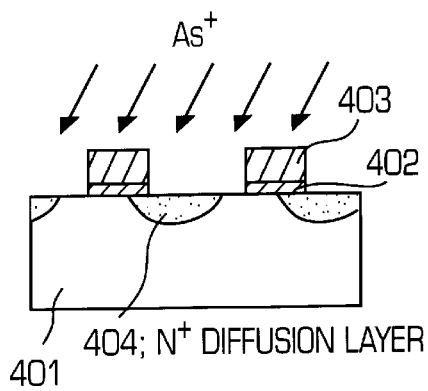

Subsequently, as shown in FIG. 6(b), by means of a self-alignment process employing the floating gates 403 as self-aligning masks, ions of N-type impurity such as arsenic (As) are implanted in an oblique or inclined direction (from right to left in FIG. 6(b)), for example, at a dose of $1\times10^{14}$ cm$^{-2}$ to $1\times10^{16}$ cm$^{-2}$ to form N$^+$ diffusion layers 404. In this step, the direction and inclination angle for the ion-implantation are determined such that one of the opposite ends (right end in FIG. 6(b)) of a respective floating gate 403 is overlapping with the N$^+$ diffusion layer 404 whereas the other end (left end in FIG. 6(b)) thereof is offset in a spaced relation to the N$^+$ diffusion layer 404.

Figure 6E:
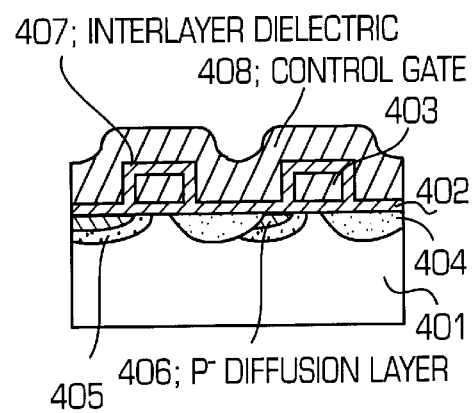
Figure 6C:
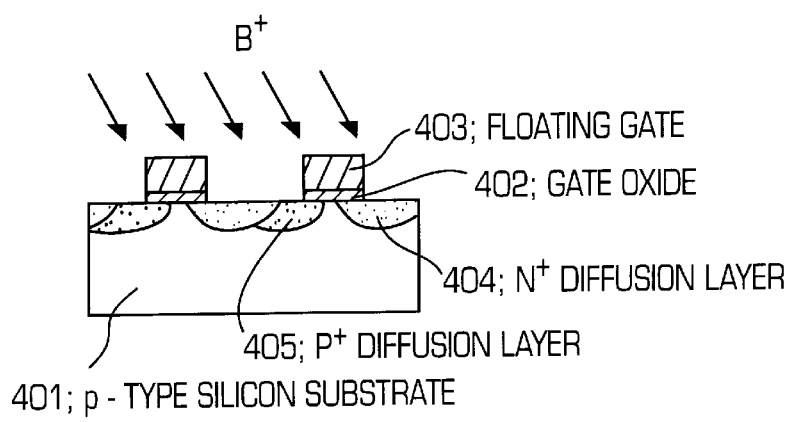

Next, referring to FIG. 6(c), again by means of a self-alignment process employing the floating gates 403 as self-aligning masks, P-type impurity, such as boron (B), is ion-implanted into the semiconductor substrate 401, in an oblique or inclined direction (from left to right) opposite to that in the previous step shown in FIG. 6(b), for example, at a dose of $1\times10^{12}$ cm$^{-2}$ to $1\times10^{15}$ cm$^{-2}$ to form a P$^+$ diffusion layer 405.

Thereafter, referring to FIG. 6(d), by means of a self-alignment process employing the floating gates 403 as self-aligning masks, ions of N-type impurity such as arsenic (As) are implanted in a direction perpendicular to the substrate, for example, at a dose of $1\times10^{11}$ cm$^{-2}$ to $1\times10^{15}$ cm$^{-2}$ to form, at the substrate surface at the split gate regions, P$^-$ diffusion layers 406 each having a concentration lower than that of P$^+$ diffusion layer 405. In this step, the split gate is regulated so as to have a desired threshold voltage within a range which does not cause depletion, by controlling the ion-implantation conditions.

Finally, as depicted in FIG. 6(e), an interlayer dielectric 407 is formed so as to cover the floating gates 403 in order to electrically insulate the floating gates 403, and control gates 408 are further formed on the interlayer dielectric 407. Thus, a memory cell transistor is manufactured.

Thus, with this second embodiment, the same advantages as in the first embodiment can also be ensured.

Obviously, many modifications and variations are possible in the light of the foregoing teachings. For example, the dose of the impurity ions and the film thickness of the gate oxides are not limited to those illustrated above. Furthermore, although in the above, explanation was made with respect to N-channel memory cell transistor, the invention can be applied to P-channel memory cell transistors as well. It is thus apparent that the present invention is not limited to the above embodiments but may be changed and modified without departing from the scope and spirit of the invention.

Finally, the present application claims the priority of Japanese Patent Application No. Hei8-333818 filed Dec. 13, 1996, which is herein incorporated by reference.

What is claimed is:

1. A method for manufacturing a nonvolatile semiconductor memory device, comprising the steps of:
   (a) preparing a semiconductor substrate of a first conductive type;
   (b) effecting an ion implantation impurity of a first conductive type unto said semiconductor substrate to provide a first impurity diffusion layer region of a first conductive type in said semiconductor substrate;
   (c) forming a gate dielectric film an said semiconductor substrate and forming a floating gate on said gate dielectric film;
   (d) ion-implanting impurity of a second conductive type into said semiconductor substrate un an oblique direction relative to a surface of said semiconductor substrate, to thereby form at least a pair of impurity diffusion layers of a second conductive type defining source and drain, with one end overlapping with said floating gate and with the other end being spaced therefrom, and forming a split gate defined by a channel uncovered with said floating gate;
   (e) ion-implanting impurity of a second conductive type into said semiconductor substrate generally perpendicularly with respect to the surface of said semiconductor substrate, to such an extent as not to invert conductive type of the semiconductor substrate at said split gate, to thereby regulate threshold voltage of the split gate;
   (f) forming an interlayer dielectric so as to cover said floating gate and forming a control gate on said interlayer dielectric.

2. A method as recited in claim 1, comprising effecting said step (b), after said step (a), to form said first impurity diffusion layer region so as to cover an entire memory transistor region of said semiconductor substrate.

3. A method as recited in claim 1, comprising effecting said step (b), between said step (d) and said step (e), to form said first impurity diffusion layer region at a channel region of a memory transistor region of said semiconductor substrate, said step (b) including ion-implanting impurity of a first conductive type into said semiconductor substrate in an oblique direction reverse to the oblique direction in said step (d), to thereby form said first impurity diffusion layer region at a channel region of a memory transistor region of said semiconductor substrate, with one end overlapping with said floating gate and with the other end being spaced therefrom.

* * * * *